United States Patent
Takashima et al.

(10) Patent No.: US 8,779,498 B2
(45) Date of Patent: Jul. 15, 2014

(54) NONVOLATILE SEMICONDUCTOR MEMORY DEVICE

(71) Applicant: Kabushiki Kaisha Toshiba, Tokyo (JP)

(72) Inventors: Akira Takashima, Fuchu (JP); Daisuke Matsushita, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/750,037

(22) Filed: Jan. 25, 2013

(65) Prior Publication Data

US 2014/0061764 A1 Mar. 6, 2014

Related U.S. Application Data

(60) Provisional application No. 61/696,869, filed on Sep. 5, 2012.

(51) Int. Cl.
*H01L 29/788* (2006.01)

(52) U.S. Cl.
USPC ........... 257/316; 257/192; 257/200; 257/315; 257/324

(58) Field of Classification Search
USPC ................ 257/192, 200, 315–316, 324–326
See application file for complete search history.

(56) References Cited

U.S. PATENT DOCUMENTS

| 8,513,725 | B2* | 8/2013 | Sakuma et al. ............... 257/314 |
| 2003/0047755 | A1 | 3/2003 | Lee et al. |
| 2007/0132004 | A1 | 6/2007 | Yasuda et al. |
| 2008/0042188 | A1 | 2/2008 | Watanabe |
| 2011/0233610 | A1* | 9/2011 | Cho et al. ...................... 257/192 |
| 2012/0025297 | A1 | 2/2012 | Takashima et al. |

FOREIGN PATENT DOCUMENTS

| JP | 2003-68897 | 3/2003 |
| JP | 2007-134681 | 5/2007 |
| JP | 2008-47704 | 2/2008 |
| JP | 2010-182963 | 8/2010 |

* cited by examiner

*Primary Examiner* — Dung A. Le
(74) *Attorney, Agent, or Firm* — Oblon, Spivak, McClelland, Maier & Neustadt, L.L.P.

(57) ABSTRACT

According to one embodiment, a nonvolatile semiconductor memory device includes a semiconductor substrate, a first gate insulating film, a charge storage layer, a second gate insulating film, and a control gate electrode. The first gate insulating film is arranged on the semiconductor substrate. The charge storage layer is arranged on the first gate insulating film, and includes aluminum and silicon. The second gate insulating film is arranged on the charge storage layer, and includes aluminum, silicon, and lanthanum. The control gate electrode is arranged on the second gate insulating film.

7 Claims, 9 Drawing Sheets

NONVOLATILE SEMICONDUCTOR MEMORY DEVICE

CROSS-REFERENCE TO RELATED APPLICATIONS

This application claims the benefit of U.S. Provisional Application No. 61/696,869, filed Sep. 5, 2012, the entire contents of which are incorporated herein by reference.

FIELD

Embodiments described herein relate generally to a nonvolatile semiconductor memory device having a memory cell of a stacked gate structure.

BACKGROUND

A stacked gate structure of a memory cell of a NAND flash memory includes a first gate insulating film, a charge storage layer, a second gate insulating film, and a control gate electrode, which are formed in order on a silicon substrate.

In recent years, as the size of a memory cell decreases, an insulating material (high-k film) having a high dielectric constant is under consideration for use as the second gate insulating film.

One of candidates of high-k films for use as the second gate insulating film includes lanthanum oxide and lanthanum oxynitride. Lanthanum oxide and lanthanum oxynitride have the property of easily absorbing water and carbon dioxide. There is a problem in that, when the second gate insulating film using lanthanum oxide or lanthanum oxynitride absorbs moisture and carbon dioxide, the insulating performance is degraded.

DETAILED DESCRIPTION

In the following description, constituent elements having approximately the same functions and configurations are denoted with the same reference numerals, and repeated explanation thereabout will be made only when it is necessary.

When the second gate insulating film using lanthanum oxide or lanthanum oxynitride and the charge storage layer using a material including silicon are brought into contact with each other and heated, the interface therebetween has a property of easily reacting. With this reaction during heating, the shape of the memory cell changes, and in addition, there is a problem in that dopants in the charge storage layer diffuse into lanthanum oxide or lanthanum oxynitride, and the insulating performance is degraded.

In general, according to one embodiment, the nonvolatile semiconductor memory device includes a semiconductor substrate, a first gate insulating film, a charge storage layer, a second gate insulating film, and a control gate electrode. The first gate insulating film is arranged on the semiconductor substrate. The charge storage layer is arranged on the first gate insulating film, and includes aluminum and silicon. The second gate insulating film is arranged on the charge storage layer, and includes aluminum, silicon, and lanthanum. The control gate electrode is arranged on the second gate insulating film.

First Embodiment

The nonvolatile semiconductor memory device according to the first embodiment will be explained in detail with reference to drawings.

Figure 1A:
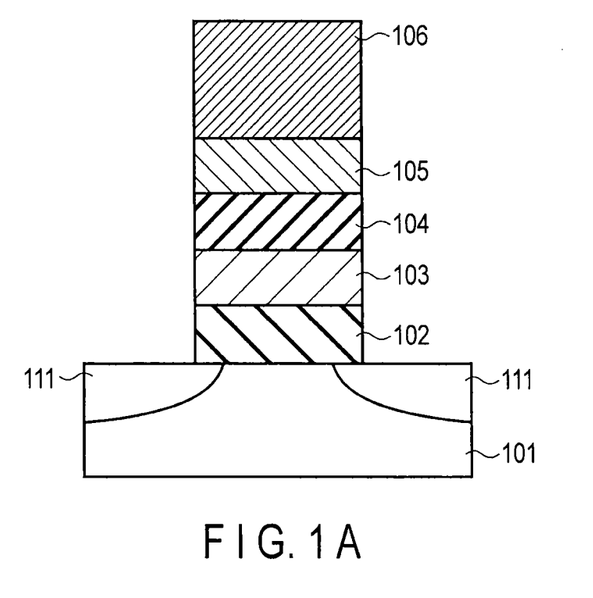
FIGS. 1A, 1B are cross sectional views illustrating a memory cell provided in a nonvolatile semiconductor memory device according to a first embodiment.
Figure 1B:
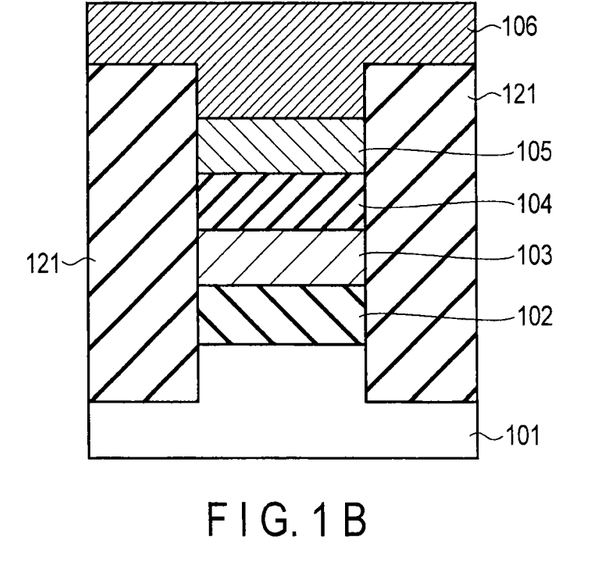

FIGS. 1A, 1B illustrate a memory cell provided in a nonvolatile semiconductor memory device according to the first embodiment. FIG. 1A is a cross sectional view of the memory cell taken along a channel length direction. FIG. 1B is a cross sectional view of the memory cell taken along a channel width direction.

As shown in FIGS. 1A, 1B, in a surface region of a p-type silicon semiconductor substrate (including well) 101, two source/drain diffusion layers 111 are arranged spaced apart from each other. A channel region is formed in the semiconductor substrate 101 between source/drain diffusion layers 111. When the memory cell is in ON state, a channel for making a portion between the source/drain diffusion layers 111 conductive is formed in the channel region.

On the channel region, a silicon oxide film 102 having, for example, thickness 7 nm is arranged as a first gate insulating film (tunnel insulating film). A polycrystal silicon film 103 into which, for example, aluminum is doped is arranged as a charge storage layer on the silicon oxide film 102. The thickness of the polycrystal silicon film 103 is, for example, 5 nm.

A lanthanum oxide film 104 including, for example, aluminum and silicon is arranged as a second gate insulating film on the polycrystal silicon film 103. The thickness of the lanthanum oxide film 104 is, for example, 10 nm. A polycrystal silicon film 105 including, for example, aluminum is arranged as a control gate electrode on the lanthanum oxide film 104. Further, a tungsten film 106, for example, low-resistance metal, is arranged on the polycrystal silicon film 105.

Multiple silicon oxide films 102, polycrystal silicon films 103, lanthanum oxide films 104, and polycrystal silicon films 105 are formed in a row direction, and they are isolated from each other by silicon oxide layers (element isolation insulating layers) 121 having a shallow trench isolation (STI) structure. The tungsten film 106 extends in the row direction to become a word line.

In this case, the film thickness of the silicon oxide film 102 serving as the first gate insulating film used in the present embodiment is preferably about 2 to 8 nm. In this case, silicon oxide is used as the first gate insulating film, but instead of silicon oxide, it may be possible to use silicon oxynitride or a two-layer laminated film including silicon oxynitride and silicon oxide. When silicon oxynitride is used for the first gate insulating film, potential barrier for holes decreases, and therefore, there is an effect of increasing erase operation of the memory cell. Alternatively, three or more layers of laminated insulating films such as silicon oxide/silicon oxynitride/silicon oxide (ONO film) may be used as the first gate insulating film. In this case, there is an effect of increasing write operation and erase operation.

The film thickness of the polycrystal silicon film 103 into which aluminum is doped serving as the charge storage layer is preferably about 2 to 9 nm. Aluminum does not necessarily be uniformly distributed in the polycrystal silicon film 103, and in order to suppress the effect of aluminum diffused into the channel region, the concentration distribution of aluminum in the polycrystal silicon film 103 is preferably low at the first gate insulating film and high at the second gate insulating film. The concentration of aluminum in the polycrystal silicon film 103 is preferably up to $1\times10^{19}$ $cm^{-3}$ which is an amount that does not affect the film structure of silicon serving as the charge storage layer.

The polycrystal silicon film 103 may be a two-layer structure including polycrystal silicon including aluminum and polycrystal silicon not including any dopant (for example, boron or phosphorus, arsenic) or polycrystal silicon into which the dopant is doped. In a case of two-layer structure, in order to prevent diffusion of dopant, silicon nitride of a thin film may be interposed between two-layers of polycrystal silicon.

In this case, polycrystal silicon is used for the charge storage layer, but the crystalline state of silicon may be either amorphous or monocrystal. In addition, the polycrystal silicon film 103 may include carbon, nitrogen, hydrogen, or oxygen. For example, the charge storage layer may be any one of a silicon film, a silicon nitride film, and a silicon oxynitride film.

The lanthanum oxide film 104 including aluminum and silicon is used for the second gate insulating film, but lanthanum oxynitride including aluminum and silicon may be used.

The polycrystal silicon film 105 including aluminum is used for the control gate electrode, but $n^+$-type polycrystal silicon into which phosphorus or arsenic, antimony is doped, and $p^+$-type polycrystal silicon into which boron is doped may also be used.

Further, the control gate electrode may be formed of a material including one or more elements selected from Pt, W, Ir, Ru, Re, Mo, Ti, Ta, Ni, Co, a silisidc of a material including one or more elements selected from Pt, W, Ti, Ta, Ni, Co, a carbide of a material including one or more elements selected from W, Ti, Ta, a nitride of a material including one or more elements selected from W, Mo, Ti, Ta, a silisidc nitride of a material including Ti, an oxide of a material including one or more elements selected from Ir, Ru, or a mixture or compound thereof.

Subsequently, advantages will be explained when the silicon film 103 including aluminum is used as the charge storage layer, and the lanthanum oxide film 104 or lanthanum oxynitride film including aluminum and silicon is used as the second gate insulating film.

The lanthanum oxide film 104 including aluminum and silicon can maintain high insulating performance while maintaining amorphous state even when heat is applied at 900 to 1100° C. The lanthanum oxide film 104 may include nitrogen. More specifically, even with lanthanum oxynitride, high insulating performance can be maintained while amorphous state can be maintained. Since nitrogen is included, it is expected to, for example, increase the crystallization temperature and improve chemical resistance.

The lanthanum oxide film 104 including aluminum and silicon has a band gap of 7.3 to 7.6 eV, and a dielectric constant of about 10 to 12, which are large (the reason why the values are expressed in ranges is that the values depend on a composition ratio of lanthanum, aluminum, and silicon). Therefore, the barrier between the second gate insulating film and the charge storage layer and the control gate electrode becomes higher, and accordingly, the electron capture efficiency increases, and the write efficiency increases, and moreover, this can suppress a so-called back tunneling current, i.e., a tunnel current from the control gate electrode occurring during erase operation. However, this back tunneling current can also be suppressed using a metal having a large work function.

Even when the lanthanum oxide film 104 serving as the second gate insulating film is heated while is it in contact with silicon or silicon nitride, silicon oxynitride are in contact, interfacial reaction layer mainly including silicon oxide is less likely to be formed.

On the other hand, in lanthanum oxide having an insufficient amount of silicon and an insufficient amount of aluminum, lanthanum oxide is chemically unstable, and is likely to absorb carbon dioxide and moisture, and in addition, it reacts with ambient elements, and therefore, the structure of the memory cell cannot be maintained. In this case, lanthanum oxide having an insufficient amount of silicon and an insufficient amount of aluminum is adopted as a block insulating film, and silicon or silicon nitride, silicon oxynitride including aluminum is adopted as the charge storage layer, and the charge storage layer and the block insulating film are laminated and heated. Then, silicon and aluminum in the charge storage layer diffuses into the block insulating film to compensate aluminum and silicon, whereby the block insulating film can maintain chemically stable state.

Further, silicon and aluminum constituting the charge storage layer is diffused and consumed in the block insulating film, so that the charge storage layer can be made into a thin film. When the charge storage layer can be made into a thin film, this can reduce the effect of interference due to capacitive coupling with an adjacent memory cell. In the lanthanum oxide film 104 including aluminum and silicon, reaction can be determined by the composition ratio of lanthanum, and therefore, the film thickness of the charge storage layer can be adjusted. More specifically, for example, the charge storage layer can be adjusted to a thickness of 3 to 7 nm, which is a film thickness that does not allow penetration of high energy electrons injected from the tunnel insulating film while suppressing the capacitive coupling with an adjacent memory cell.

Subsequently, the production method of the memory cell of the first embodiment will be explained.

Figure 4:
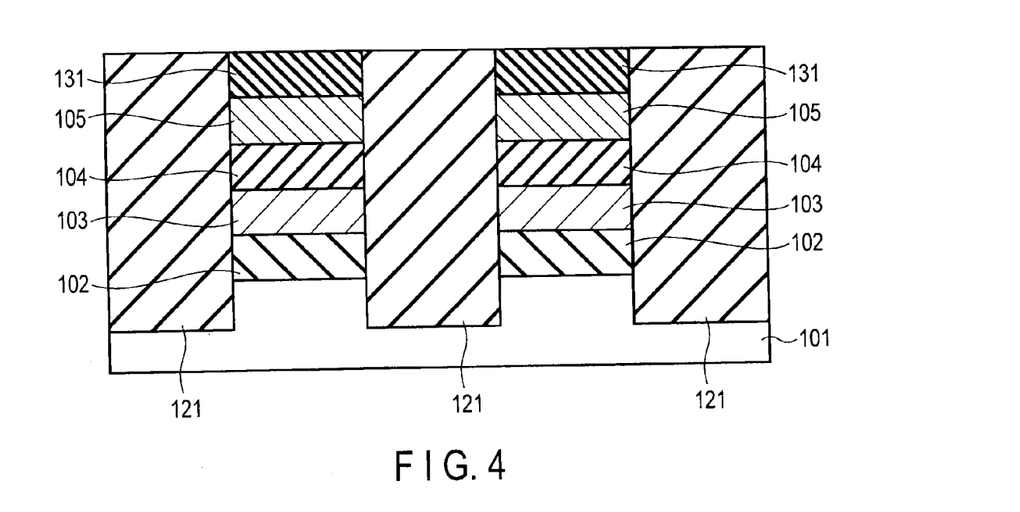
Figure 5:
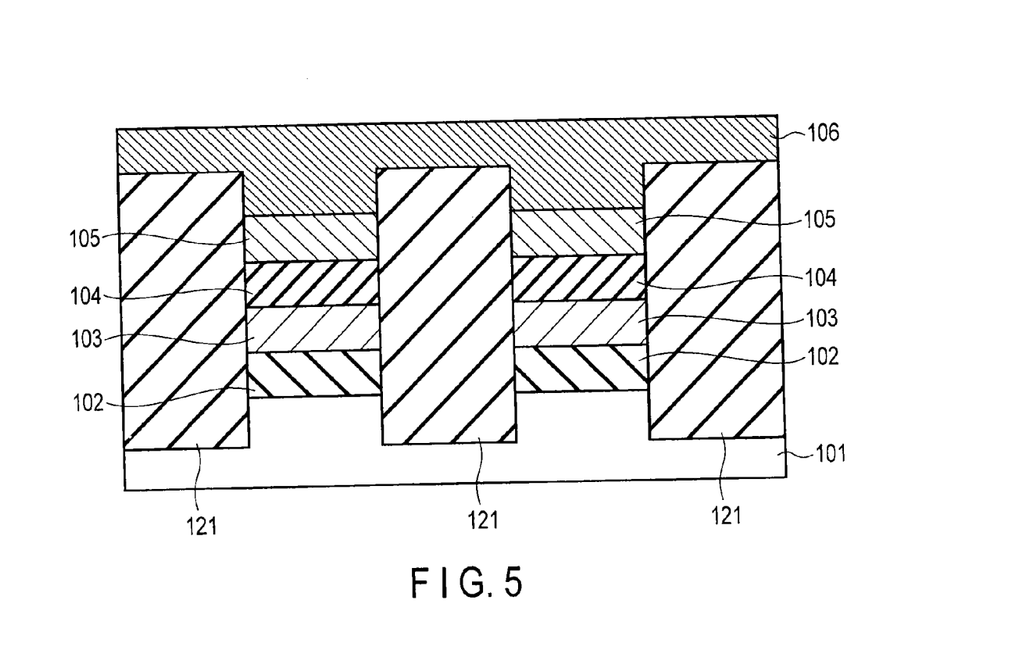
Figure 6:
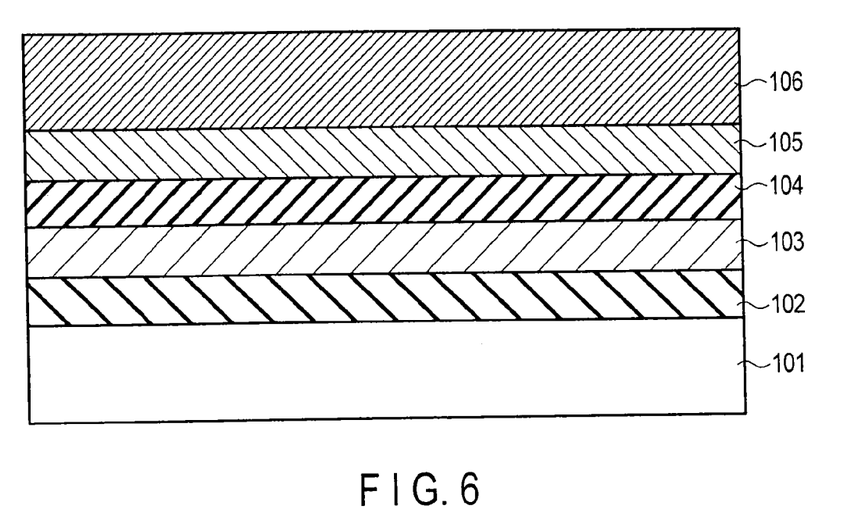
Figure 7:
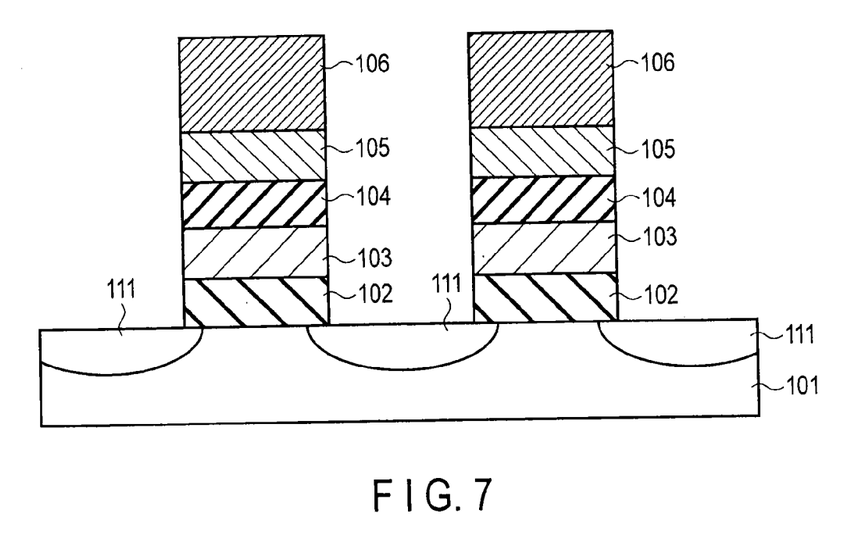

FIGS. 2 to 7 illustrate the production method of the memory cell according to the first embodiment. FIGS. 2 to 5 are cross sectional views illustrating the memory cell taken along the channel width direction. FIGS. 6, 7 are cross sectional views illustrating the memory cell taken along the channel length direction.

Figure 2:
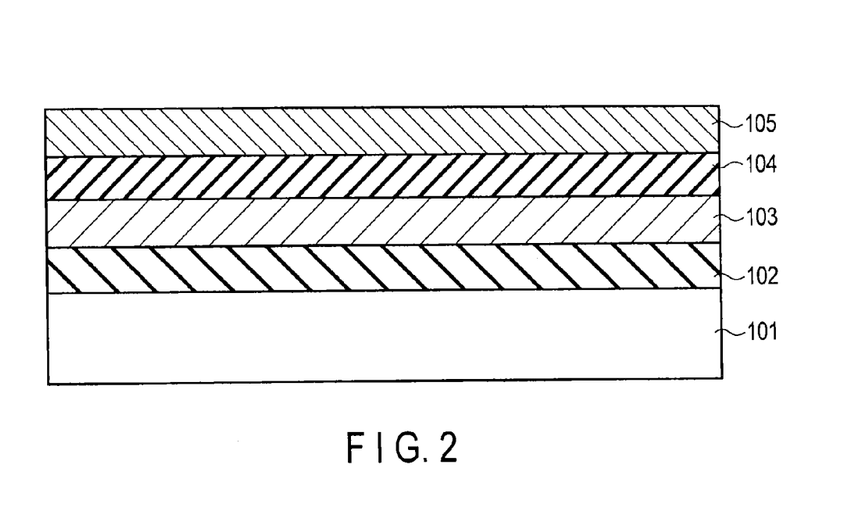
FIGS. 2 to 7 are cross sectional view illustrating a production method of the memory cell according to the first embodiment.

As shown in FIG. 2, first, the surface of the p-type silicon substrate (including well) 101 is cleaned, and thereafter, the silicon oxide film 102 of, for example, a thickness of 7 nm, is formed by thermal oxidation in a temperature range of 800 to 1000° C. Subsequently, the polycrystal silicon film (charge storage layer) 103 of, for example, a thickness of 7 nm is formed on the silicon oxide film 102 by low-pressure chemical vapor deposition (LPCVD) using silane ($SiH_4$) as a source gas in a temperature range of 600 to 800° C. Subsequently, aluminum is doped into the polycrystal silicon film 103 by ion implantation method.

Subsequently, the lanthanum oxide film 104 of, for example, 10 nm including aluminum and silicon is deposited by atomic layer deposition (ALD) in a temperature range of room temperature to 400° C. Further, heat treatment is performed at 900 to 1050° C. in a rapid heating furnace. During this heat treatment, a portion of the polycrystal silicon film 103 reacts with the lanthanum oxide film 104, so that the polycrystal silicon film 103 including aluminum is made into a thin film, and the film thickness becomes 4 to 5 nm.

Subsequently, silicon of a thickness of 6 nm is formed on the lanthanum oxide film 104 by LPCVD using silane ($SiH_4$) as a source gas. Subsequently, aluminum is doped into silicon by ion implantation and activating annealing process is performed, so that as shown in FIG. 2, the polycrystal silicon film (control gate electrode) 105 doped with aluminum is formed.

Subsequently, a mask film 131 for processing element isolation regions is formed on the polycrystal silicon film 105. Photoresist is formed on the mask film 131, and the photoresist is exposed and developed. Then, the pattern of the photoresist is transferred onto the mask film 131 by reactive ion etching (RIE). Thereafter, the photoresist is removed. In this state, as shown in FIG. 3, the polycrystal silicon film 105, the lanthanum oxide film 104, the polycrystal silicon film 103, and the silicon oxide film 102 are etched in order by RIE method using the mask film 131 as a mask, and slits 122 isolating the memory cells adjacent in the row direction from each other are formed.

On this occasion, when gas including fluorine such as $CF_4$ and $CHF_3$ is used for RIE, fluorine may be injected into the lanthanum oxide film 104 including aluminum and silicon, depending on conditions of RIE. Thereafter, annealing is applied in a range of 400 to 950° C., and the fluorine injected into the lanthanum oxide film 104 is stabilized, so that this improves acid resistance in acid treatment of the lanthanum oxide film 104. When a type of gas not including any fluorine is used, the same effects can be obtained by later introducing fluorine by ion implantation.

Figure 3:
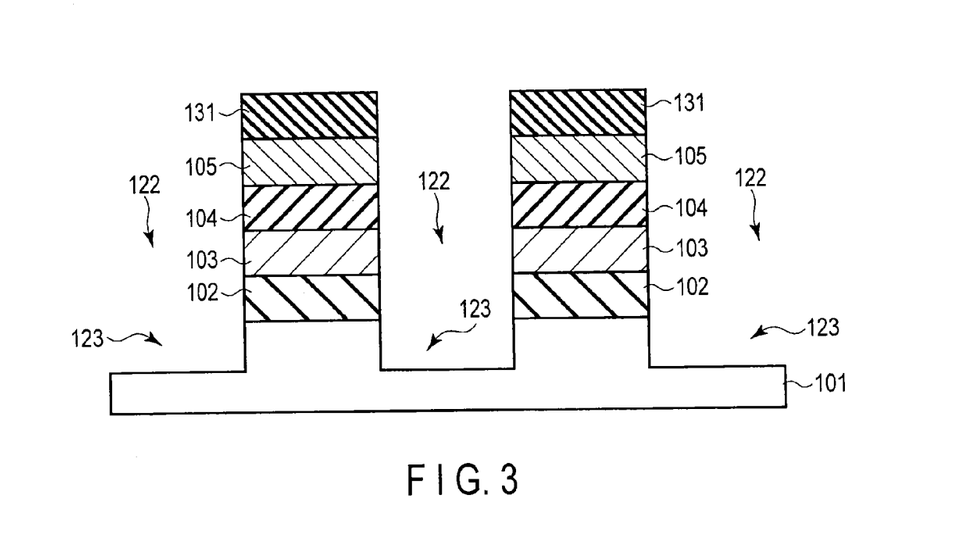

Further, as shown in FIG. 3, the p-type silicon substrate 101 is etched by RIE, and the element isolation trench 123 of a depth of about 100 nm is formed in the p-type silicon substrate 101.

Subsequently, silicon oxide layer (embedded oxidized film) 121 completely filling the slits 122 and element isolation trenches 123 is formed by CVD. Subsequently, as shown in FIG. 4, a silicon oxide layer 121 is ground by chemical mechanical polishing (CMP) until the mask film 131 is exposed, and the surface of the silicon oxide layer 121 is planarized. Thereafter, the mask film 131 is selectively removed.

Subsequently, as shown in FIG. 5, the tungsten film (word line) 106 of a low-resistance metal of which thickness is about 100 nm is formed on the polycrystal silicon film (control gate electrode) 105 by CVD method using $WF_6$ or $W(CO)_6$ as a source gas in, for example, a temperature range of 400 to 600° C. FIG. 6 shows a cross sectional view illustrating the structure of FIG. 5 taken along the channel width direction.

Subsequently, a mask film is formed on the tungsten film 106 by CVD method. Photoresist is formed on the mask film, and the photoresist is exposed and developed. Then, the pattern of the photoresist is transferred onto the mask film by RIE. Thereafter, the photoresist is removed.

Subsequently, as shown in FIG. 7, tungsten film 106, polycrystal silicon film 105, lanthanum oxide film 104, polycrystal silicon film 103, silicon oxide film 102 are etched in order by RIE using the mask film as a mask, so that the stacked gate structure is formed.

In steps subsequent thereto, processing is performed to form silicon oxide on side surfaces of the stacked gate structure by CVD. Thereafter, the source/drain diffusion layers 111 are formed in the surface region of the p-type silicon substrate 101 by self-aligning by ion implantation, and the memory cell is completed. Finally, an interlayer insulating film (not shown) is formed by CVD to cover the memory cell.

The above production method is merely an example. The memory cell may also be formed by a production method other than the above. For example, silicon oxide serving as the tunnel insulating film can be made not only by dry oxidation but also using various kinds of methods such as wet oxidation (hydrogen combustion oxidation), plasma oxidation using $O_2$ or $H_2O$ as a source gas, and deposition methods by LPCVD and ALD. Further, a step of applying gaseous NO, gaseous $NH_3$, or nitrogen plasma may be employed before or after thermal oxidation to form silicon oxynitride.

Tungsten, lanthanum oxide including aluminum and silicon may be formed using any one of pulsed laser deposition (PLD), ALD, molecular beam epitaxy (MBE), CVD, metal organic chemical vapor deposition (MOCVD), and sputtering. Further, the source gas used for CVD forming each film constituting the stacked gate structure may be replaced with other gases.

The CVD used in the above production method may be replaced by sputtering. Further, deposition of each layer of the stacked gate structure are formed by methods other than CVD and sputtering, i.e., may also be formed by methods such as evaporation, laser ablation, and MBE, and methods obtained by combining these methods.

According to the first embodiment, the lanthanum oxide film (or lanthanum oxynitride film) including aluminum and silicon is used for the second gate insulating film, and the silicon film including aluminum is used for the charge storage layer, so that the memory structure capable of maintaining insulating performance of the second gate insulating film can be provided.

Second Embodiment

The nonvolatile semiconductor memory device according to the second embodiment will be explained in detail with reference to drawings.

Figure 8A:
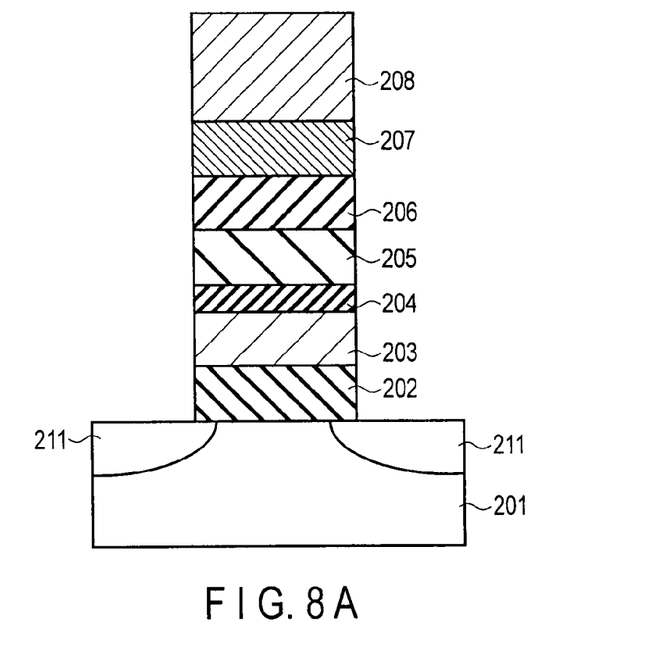
FIGS. 8A, 8B are cross sectional views illustrating a memory cell provided in a nonvolatile semiconductor memory device according to a second embodiment.
Figure 8B:
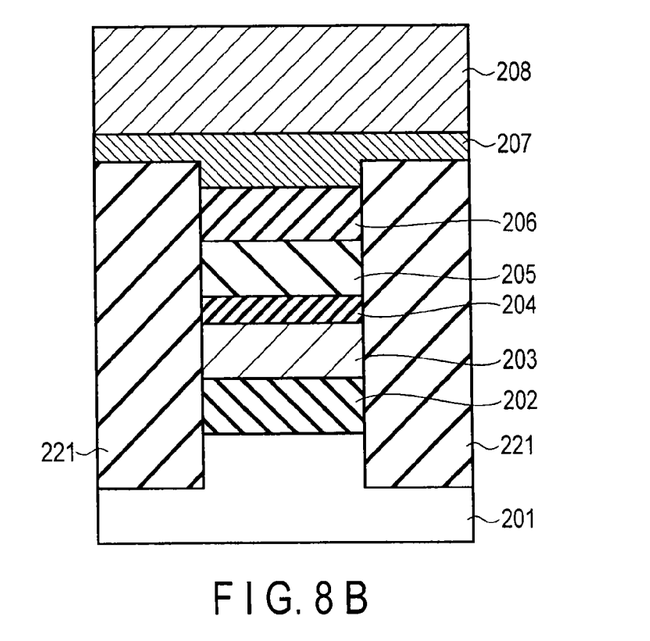

FIGS. 8A, 8B illustrate a memory cell provided in a nonvolatile semiconductor memory device according to the second embodiment. FIG. 8A is a cross sectional view of the memory cell taken along a channel length direction. FIG. 8B is a cross sectional view of the memory cell taken along a channel width direction.

As shown in FIGS. 8A, 8B, in a surface region of a p-type silicon semiconductor substrate (including well) 201, two source/drain diffusion layers 211 are arranged spaced apart from each other. A channel region is formed in a semiconductor substrate 201 between source/drain diffusion layers 211. When the memory cell is in ON state, a channel for making a portion between the source/drain diffusion layers 211 conductive is formed in the channel region.

On the channel region, a silicon oxide film 202 having, for example, thickness 7 nm is arranged as a first gate insulating film (tunnel insulating film). For example, a polycrystal silicon film 203 into which boron is doped, a silicon oxynitride film 204, and a hafnium oxide film 205 including aluminum and silicon are arranged in order as a charge storage layer on the silicon oxide film 202. For example, the thickness of the polycrystal silicon film 203 is 6 nm, the thickness of the silicon oxynitride film 204 is 2 nm, and the thickness of the hafnium oxide film 205 is 5 nm.

The silicon oxynitride film 204 is a diffusion preventing layer for preventing dopants (for example, aluminum, boron) from diffusing among the hafnium oxide film 205 and the polycrystal silicon film 203. The hafnium oxide film 205 not only accumulates charges but also plays the role of the insulating film.

For example, the lanthanum oxide film 206 including aluminum and silicon is arranged as the second gate insulating film on the hafnium oxide film 205. The thickness of the lanthanum oxide film 206 is, for example, 6 nm. For example, a tungsten nitride film 207 is arranged as the control gate electrode on the lanthanum oxide film 206. Further, the tungsten film 208 serving as the low-resistance metal is arranged on the tungsten nitride film 207.

Multiple silicon oxide films 202, polycrystal silicon films 203, silicon oxynitride films 204, hafnium oxide films 205, lanthanum oxide films 206, and tungsten nitride films 207 are formed in a row direction, and they are isolated from each other by silicon oxide layers (element isolation insulating layers) 221 having a shallow trench isolation (STI) structure. The tungsten film 208 extends in the row direction to become a word line.

In this case, the film thickness of the silicon oxide film 202 serving as the tunnel insulating film used in the present embodiment is preferably about 3 to 10 nm. In this case, silicon oxide is used as the tunnel insulating film, but instead of silicon oxide, it may be possible to use silicon oxynitride. When silicon oxynitride is used for the tunnel insulating film, potential barrier for holes decreases, and therefore, there is an effect of increasing erase operation of the memory cell. Alternatively, a laminated tunnel insulating film such as silicon oxide/silicon nitride/silicon oxide may also be used as the tunnel insulating film. In this case, there is an effect of increasing write operation and erase operation.

The film thickness of the polycrystal silicon film 203 into which boron is doped and which is used as the charge storage layer (floating gate electrode) may be about 2 to 10 nm. The polycrystal silicon film 203 into which boron is doped is used for the floating gate electrode, but $p^+$-type polycrystal silicon into which aluminum is doped, and $n^+$-type polycrystal silicon into which phosphorus or arsenic or antimony is doped may also be used. The silicon oxynitride film 204 serving as the diffusion preventing layer may be silicon nitride.

The hafnium oxide film 205 including aluminum and silicon may be oxynitride, and hafnium may be replaced with zirconium. In other words, the hafnium oxide film 205 may be replaced with any one of hafnium oxynitride or zirconium oxide, zirconium oxynitride. Further, the hafnium oxide film 205 may be replaced with any one of silicon film or silicon nitride film, silicon oxynitride film including aluminum.

Aluminum does not necessarily be uniformly distributed in the hafnium oxide film 205, and in order to suppress the effect of aluminum diffused into the channel region, the concentration distribution of aluminum in the hafnium oxide film 205 is preferably low at the first gate insulating film and high at the second gate insulating film.

Hafnium and zirconium may be diffused into the lanthanum oxide film 206 including aluminum and silicon serving as the second gate insulating film. The lanthanum oxide film 206 including aluminum and silicon is used for the second gate insulating film, but it is possible to use the lanthanum oxynitride including aluminum and silicon.

Further, the control gate electrode may be formed by a material including one or more elements selected from Pt, W, Ir, Ru, Re, Mo, Ti, Ta, Ni, Co, a siliside of a material including one or more elements selected from Pt, W, Ti, Ta, Ni, Co, a carbide of a material including one or more elements selected from W, Ti, Ta, a nitride of a material including one or more elements selected from W, Mo, Ti, Ta, a silicide nitride of a material including Ti, an oxide of a material including one or more elements selected from Ir, Ru, or a mixture or compound thereof.

As described in the first embodiment, electronic barrier of the lanthanum oxide film 206 with respect to the charge storage layer is high, and the electron capture efficiency can be improved, and the back tunneling of electrons can be suppressed, and as a result, the memory cell can be achieved with low voltage driving.

Subsequently, the production method of the memory cell of the second embodiment will be explained.

Figure 12:
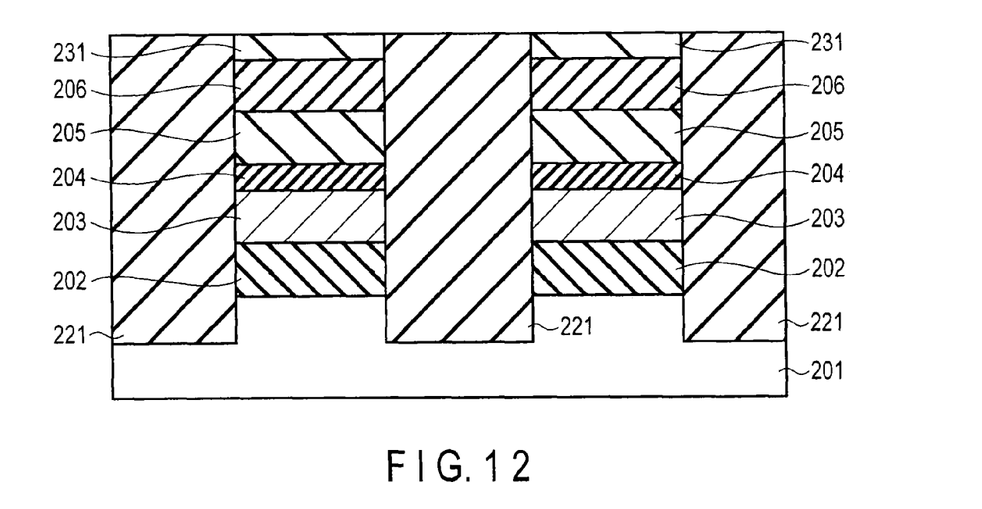
Figure 13:
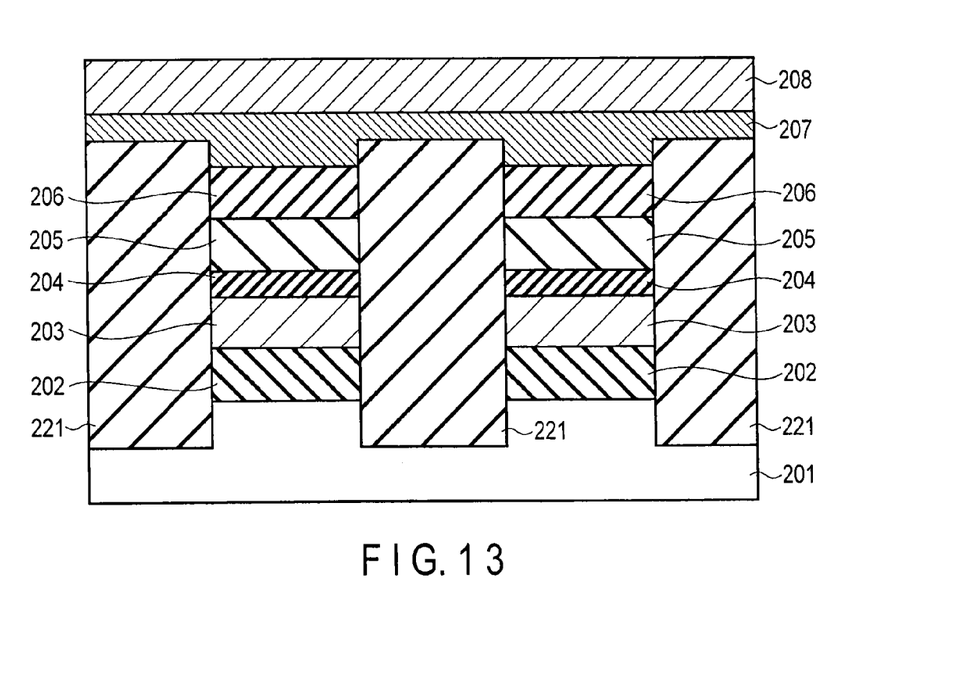
Figure 14:
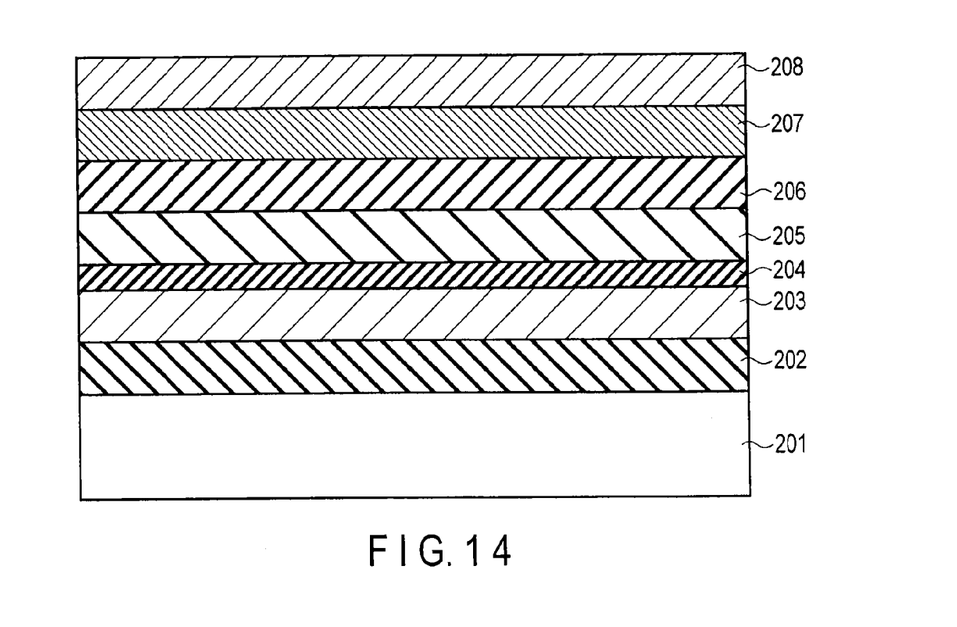
Figure 15:
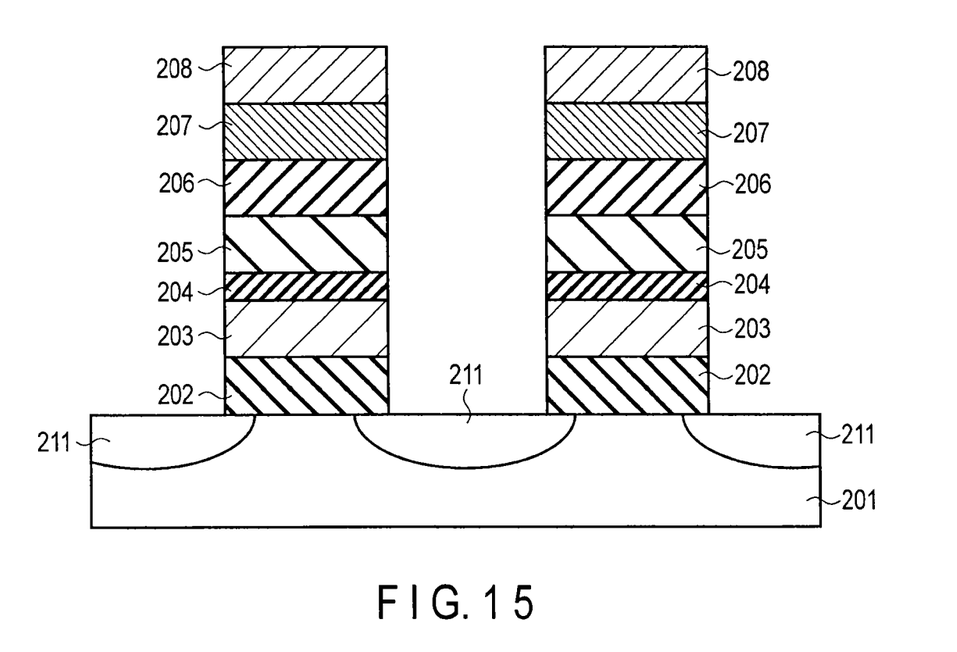

FIGS. 9 to 15 illustrate a production method of the memory cell according to the second embodiment. FIGS. 9 to 13 are cross sectional views illustrating the memory cell taken along the channel width direction. FIGS. 14, 15 are cross sectional views illustrating the memory cell taken along the channel length direction.

Figure 9:
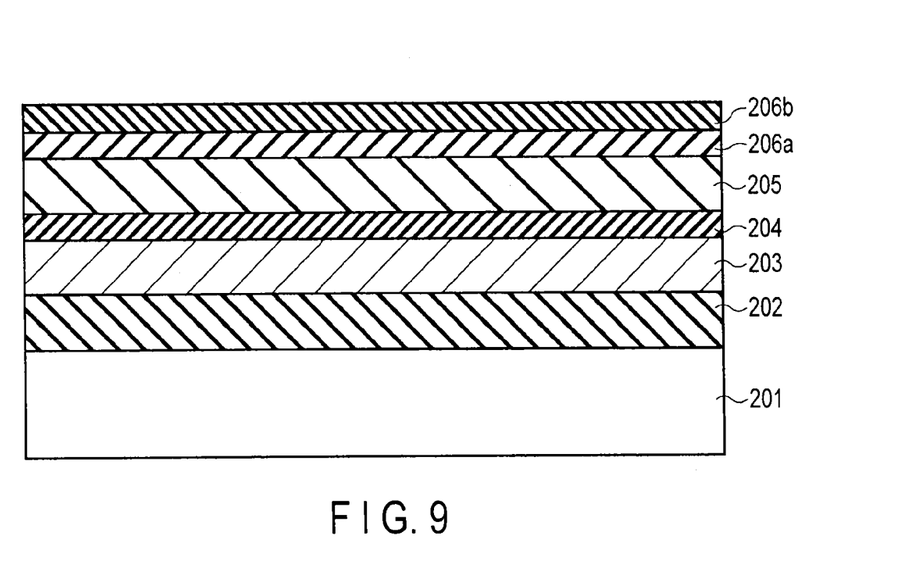
FIGS. 9 to 15 are cross sectional view illustrating a production method of the memory cell according to the second embodiment.

As shown in FIG. 9, first, the surface of the p-type silicon substrate (including well) 201 is cleaned, and thereafter, a silicon oxide film (tunnel insulating film) 202 of, for example, a thickness of 7 nm, is formed by thermal oxidation in a temperature range of 800 to 1000° C. Subsequently, a polycrystal silicon film 203 of, for example, a thickness of 5 nm, into which boron is doped and which is to be a floating gate electrode is formed on the silicon oxide film 202 by LPCVD using silane ($SiH_4$) and diborane ($B_2H_6$) as a source gas in a temperature range of 550 to 700° C. On this occasion, when the temperature is low, an amorphous silicon film is obtained.

Subsequently, a silicon oxynitride film 204 and a hafnium oxide film 205 including aluminum and silicon are deposited on the polycrystal silicon film 203 by ALD.

Thereafter, a silicon oxide film 206a of, for example, 2 nm, is formed by ALD using BTBAS [Bis(tertiary-butylamino)silane:$SiH_2$ (t-$BuNH)_2$] and ozone ($O_3$) as a source gas or 3DMAS ($SiH(N(CH_3)_2)_3$) and ozone ($O_3$) as a source gas in a temperature range of 200 to 500° C.

Figure 10:
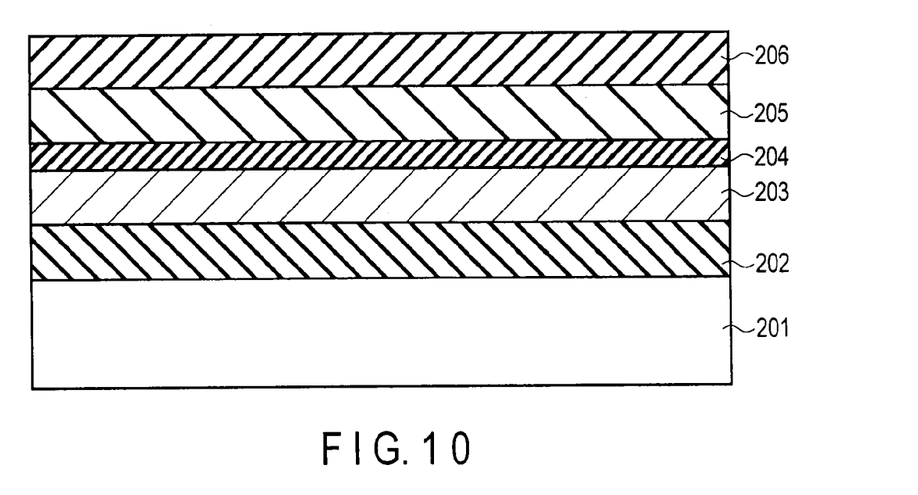

Subsequently, a lanthanum oxide film 206b including aluminum of, for example, 4 nm, is formed by ALD in a temperature range of room temperature to 700° C. Subsequently, heat treatment is performed at 900 to 1050° C. in a rapid heating furnace, so that the silicon oxide film 206a is mixed with the lanthanum oxide film 206b including aluminum, and as shown in FIG. 10, the lanthanum oxide film 206 including aluminum and silicon is formed. During this mixing anneal process, aluminum and silicon are further provided from the hafnium oxide film 205 including aluminum and silicon to the lanthanum oxide film 206.

Subsequently, a mask film 231 for processing element isolation regions is formed. Photoresist is formed on the mask film 231, and the photoresist is exposed and developed. Then, the pattern of the photoresist is transferred onto the mask film 231 by RIE. Thereafter, the photoresist is removed. In this state, as shown in FIG. 11, the lanthanum oxide film 206, the hafnium oxide film 205, the silicon oxynitride film 204, the polycrystal silicon film 203, and the silicon oxide film 202 are etched in order by RIE method using the mask film 231 as a mask, and slits 222 isolating the memory cells adjacent in the row direction from each other are formed.

Figure 11:
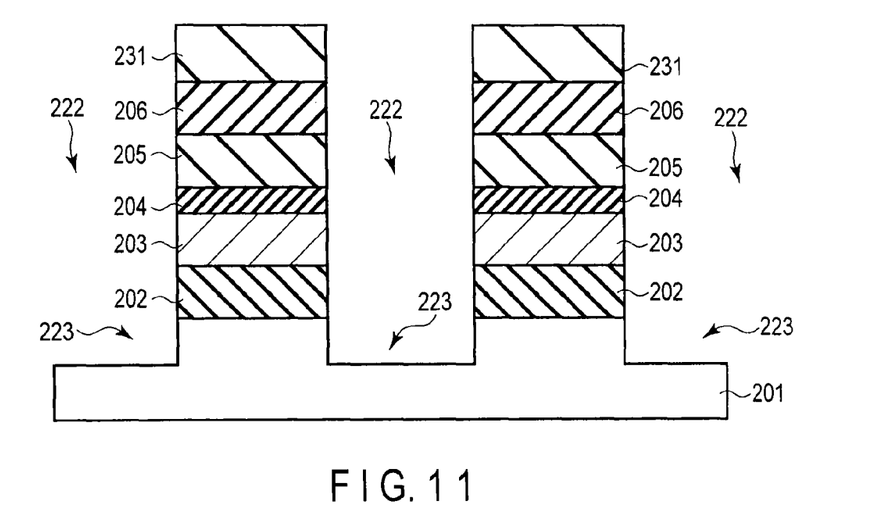

Further, as shown in FIG. 11, the p-type silicon substrate 201 is etched by RIE, and the element isolation trench 223 of a depth of about 100 nm is formed in the p-type silicon substrate 201.

Subsequently, silicon oxide layer (embedded oxidized film) 221 completely filling the slits 222 and element isolation trenches 223 is formed by CVD. Subsequently, as shown in FIG. 12, a silicon oxide layer 221 is ground by CMP until the mask film 231 is exposed, and the surface of the silicon oxide layer 221 is planarized. Thereafter, the mask film 231 is selectively removed.

Subsequently, as shown in FIG. 13, the tungsten nitride film 207 of, for example, a thickness of 2 nm and the tungsten film (word line) 208 of a low-resistance metal of which thickness is about 10 nm is formed on the lanthanum oxide film 206 by the CVD method using $WF_6$ or $W(CO)_6$ as a source gas in, for example, a temperature range of 400 to 600° C. FIG. 14 shows a cross sectional view illustrating the structure of FIG. 13 taken along the channel width direction.

Subsequently, a mask film is formed on the tungsten film 208 by CVD method. Photoresist is formed on the mask film, and the photoresist is exposed and developed. Then, the pattern of the photoresist is transferred onto the mask film by reactive ion etching (RIE). Thereafter, the photoresist is removed.

Subsequently, as shown in FIG. 15, the tungsten film 208, the tungsten nitride film 207, the lanthanum oxide film 206, the hafnium oxide film 205, the silicon oxynitride film 204, the polycrystal silicon film 203, and the silicon oxide film 202 are etched in order by RIE using the mask film as a mask, so that the stacked gate structure of the flash memory is formed.

In steps subsequent thereto, processing is performed to form silicon oxide on side surfaces of the MONOS stacked gate structure by CVD. Thereafter, the source/drain diffusion layers 211 are formed in the surface region of the p-type silicon substrate 201 by self-aligning by ion implantation, and the memory cell is completed. Finally, an interlayer insulating film (not shown) is formed by CVD to cover the memory cell.

The above production method is merely an example. The memory cell may also be formed by a production method other than the above. For example, the tunnel insulating film can be thermally treated not only by dry oxidation but also using various kinds of methods such as wet oxidation (hydrogen combustion oxidation), plasma oxidation using $O_2$ or $H_2O$ as a source gas, and deposition methods by LPCVD and ALD. Further, a step of applying gaseous NO, gaseous $NH_3$, or nitrogen plasma may be employed before or after thermal oxidation to form silicon oxynitride.

The polycrystal silicon film 203 into which boron is doped is used for the floating gate electrode, but p-type polycrystal silicon into which aluminum is doped, and $n^+$-type polycrystal silicon into which phosphorus or arsenic is doped may also be used. The lanthanum oxide film 206 including aluminum and silicon, the hafnium oxide film 205 including aluminum and silicon, the tungsten nitride film 207, and the tungsten film 208 can be formed not only by ALD but also by any one of PLD, MBE, CVD, MOCVD, and sputtering method. Further, the source gas used for CVD forming each film constituting the floating-gate-type gate stacked structure may be replaced with other gases.

The CVD used in the above production method may be replaced by sputtering. Further, deposition of each layer of the stacked gate structure are formed by methods other than CVD and sputtering, i.e., may also be formed by methods such as evaporation, laser ablation, and MBE, and methods obtained by combining these methods.

According to the second embodiment, the lanthanum oxide film (or lanthanum oxynitride film) including aluminum and silicon is used for the second gate insulating film, and the hafnium oxide film (or hafnium oxynitride film and the like) including aluminum and silicon is used for the charge storage layer, so that the memory structure capable of maintaining insulating performance of the second gate insulating film can be provided.

Example of Application

The embodiments can be mainly applied to a nonvolatile semiconductor memory having a memory cell in which a charge storage layer is constituted by an insulating film, and more particularly, the embodiments can be applied to a flash memory having a NAND-type device configuration. In the embodiments, for example, polycrystal silicon and hafnium oxide are shown as examples of the charge storage layer. However, the charge storage layer is not necessarily limited to polycrystal silicon and hafnium oxide. The embodiments can also be applied even in a case of a charge storage layer of a high-dielectric-constant insulating film (high-k film). For example, when the charge storage layer is zirconium oxide and hafnium oxide, silicon oxide, then nitrogen may be applied thereto.

Still further, the charge storage layer may not necessarily be an insulating film layer having a finite thickness. For example, the embodiments may also be applied to "interface-trap-type memory" using charge trapping center existing at an interface between the tunnel insulating film and the block insulating film, instead of the charge storage layer.

Further, more specifically, the present embodiments are an example about a block insulating film existing between the charge storage layer and the control gate electrode, and targets to which the present embodiments are applied are not necessarily limited to MONOS- and SONOS-type memory cells. Therefore, the second gate insulating film according to the present embodiment can also be applied to an interpoly-insulating film between a floating gate electrode and a control gate electrode in a floating-gate-type memory cell, for example. In addition, it is also possible to be used as a block insulating film of a nanodot-type memory cell.

When a method for structuring a second gate insulating film is peculiar, the present embodiments can be applied regardless of dopant impurity distribution at the substrate. Therefore, for example, when a memory cell does not have source/drain diffusion layers, for example, the embodiments are effective to a D-type NAND cell and a case where source/drain are formed with fringing field from an upper electrode.

Based on similar considerations, the stacked gate structure according to the present embodiments may not be necessarily formed on the silicon substrate. For example, the stacked gate structure of the present embodiment may be formed on a well region formed on a silicon substrate. Instead of a silicon substrate, it is possible to use an SiGe substrate, a Ge substrate, an SiGeC substrate, and the like, and the stacked gate structure of the present embodiments may be formed on the well region of these substrates.

Further, in the present embodiment, it is possible to use a silicon-on-insulator (SOI) substrate, a silicon-germanium-on-insulator (SGOI) substrate, and a germanium-on-insulator (GOI) substrate in which a film semiconductor is formed on an insulating film, and the stacked gate structure of the present embodiments may be formed on the well region of these substrates.

In the present embodiments, the memory cell/gate stack structure of the n-channel transistor on the p-type silicon substrate (including well region) has been described, but this may be replaced with the memory cell/gate stack structure of the p-channel transistor on the n-type silicon substrate (including well region). In this case, the conductivity type of the source or drain diffusion layer is p-type.

The present embodiments are an example relating to element techniques in the memory cell, and are not dependent on how connection is made at the circuit level of the memory cell. Therefore, the present embodiments can be applied not only to NAND-type nonvolatile semiconductor memory but also to NOR-, AND- and DINOR-type nonvolatile semiconductor memories, two-transistor flash memories combining the advantages of the NOR and NAND types, three-transistor NAND-type memories having a structure in which one memory cell is sandwiched between two selection transistors, and the like.

Further, the second gate insulating film of the present embodiments are characterized in reducing the leakage current in both of a low electric field region and a high electric field region, and therefore, targets of application are not necessarily limited to a nonvolatile semiconductor memory. For example, it is possible to be used as an insulating film of a DRAM capacitor, a gate insulating film of a CMOS transistor, and the like.

In the above embodiments, the nonvolatile semiconductor memory device capable of preventing degradation of the insulating performance of lanthanum oxide or lanthanum oxynitride used as the second gate insulating film and arranged between the charge storage layer (floating gate electrode) and the control gate electrode can be provided. In other words, the embodiments can provide the memory structure capable of maintaining the insulating performance of the second gate insulating film by using oxide or oxynitride including silicon and aluminum and lanthanum for the second gate insulating film and using a material including silicon and aluminum for the charge storage layer.

As described above, according to the embodiment, a material including aluminum and silicon is used for the charge storage layer, and lanthanum oxide or lanthanum oxynitride including aluminum and silicon is used for the second gate insulating film, so that aluminum and silicon in the charge storage layer are diffused into the second gate insulating film, and this improves chemical stability of the second gate insulating film. Therefore, since the insulating performance of the second gate insulating film and the memory cell structure can be maintained, a nonvolatile memory cell structure superior in write/erase and charge maintenance characteristics can be provided.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
   a semiconductor substrate;
   a first gate insulating film which is arranged on the semiconductor substrate;
   a charge storage layer arranged on the first gate insulating film and including a first layer which includes any one of a hafnium oxide film, a hafnium oxynitride film, a zirconium oxide film, and a zirconium oxynitride film including aluminum and silicon;
   a second gate insulating film which is arranged on the charge storage layer and which includes any one of lanthanum oxide and lanthanum oxynitride including aluminum and silicon; and
   a control gate electrode arranged on the second gate insulating film.

2. The device according to claim 1, wherein a concentration distribution of aluminum in the charge storage layer is high at the second gate insulating film, and low at the first gate insulating film.

3. The device according to claim 1, further comprising a silicon film as a second layer arranged between the first gate insulating film and the first layer.

4. The device according to claim 3, wherein the silicon film includes at least one of boron, phosphorus, arsenic, and antimony.

5. The device according to claim 1, wherein the charge storage layer further includes any one of a silicon nitride film and a silicon oxynitride film.

6. The device according to claim 3, further comprising any one of a silicon nitride film and a silicon oxynitride film between the first layer and the second layer.

7. The device according to claim 3, wherein the silicon film is a polycrystal silicon film.

* * * * *